United States Patent [19]

Garbarino et al.

[11] 4,191,603
[45] Mar. 4, 1980

[54] MAKING SEMICONDUCTOR STRUCTURE WITH IMPROVED PHOSPHOSILICATE GLASS ISOLATION

[75] Inventors: Paul L. Garbarino, Ridgefield, Conn.; Martin Revitz, Poughkeepsie; Joseph F. Shepard, Hopewell Junction, both of N.Y.

[73] Assignee: International Business Machines Corporation, Armonk, N.Y.

[21] Appl. No.: 901,901

[22] Filed: May 1, 1978

[51] Int. Cl.² .......................................... H01L 21/225
[52] U.S. Cl. .................................... 148/187; 148/188; 427/86
[58] Field of Search .................. 148/187, 188; 357/91; 427/86; 29/571

[56] References Cited

U.S. PATENT DOCUMENTS

| | | | |
|---|---|---|---|
| 3,897,282 | 7/1975 | White | 148/175 |
| 3,915,767 | 10/1975 | Welliver | 148/188 |
| 4,028,150 | 6/1977 | Collins et al. | 148/187 |
| 4,075,045 | 2/1978 | Rideout | 29/571 X |
| 4,085,498 | 4/1978 | Rideout | 29/571 |

*Primary Examiner*—G. Ozaki
*Attorney, Agent, or Firm*—Theodore E. Galanthay

[57] ABSTRACT

In a field effect device such as a charge coupled device or field effect transistor in which at least two levels of polycrystalline silicon conductors are used; these two levels of polycrystalline silicon are isolated from one another with a dielectric layer. Disclosed is a dielectric layer of reflowed phosphosilicate glass (PSG) on top surfaces of a polycrystalline silicon layer which may be doped by phosphorous impurities diffusing from the PSG.

6 Claims, 4 Drawing Figures

MAKING SEMICONDUCTOR STRUCTURE WITH IMPROVED PHOSPHOSILICATE GLASS ISOLATION

DESCRIPTION

Technical Field

This invention relates to field effect circuit devices such as charge coupled devices and field effect transistors, and more particularly to a means for isolating several different levels of conductive lines.

One object of the present invention is to provide an improved isolation between a first level of polycrystalline silicon (polysilicon) material and a subsequently formed conductive line.

Another object of the present invention is to provide an improved isolation between two levels of polysilicon material.

Still another object of this invention is to eliminate overhang of a dielectric layer over a polycrystalline silicon layer.

A still further object of this invention is to seal pin holes in a dielectric layer covering a polycrystalline silicon layer.

Lastly, it is an object of this invention to utilize a phosphosilicate glass dielectric layer as a diffusion source for an adjacent polysilicon region.

BACKGROUND ART

It is well known in the prior art to fabricate field effect devices such as charge coupled devices and field effect transistors incorporating the use of several levels of conductors. It has become desirable to use polycrystalline silicon (also referred to as polysilicon) instead of metal for the conductive lines. For proper operation of the resultant field effect devices, it is necessary to insulate the two levels of polysilicon from each other. Particularly, problems have been occasioned by a failure of the insulator between a sidewall of the first polysilicon layer and the second polysilicon layer. One source of failure has been caused by pin holes in the dielectric material. Another source of failure is the difficulty in insulating the sidewall of the first polysilicon layer which is frequently under an overhanging dielectric portion. Such an overhang situation is caused by over etching of the polysilicon material when the dielectric is used as a mask. The amount of overhang is a function of polysilicon etching efficiency; but in order to assure that the polysilicon is etched completely down to the gate oxide, some overhang will always exist. This overhang inevitably produces a difficult topology for an insulating layer and a subsequent level of polysilicon to contour.

In order to avoid defects in the insulation, such as pin holes, and to avoid dielectric breakdown, it is known to increase the thickness of the insulator covering portions of the first polysilicon layer (including the critical sidewall). By conventional techniques, however, this also increases the thickness of the gate insulator (usually gate oxide). Gate oxide is usually very thin and increasing its thickness has significant adverse affects on the performance of the resultant field effect devices.

BRIEF DESCRIPTION OF THE DRAWINGS

In the accompanying drawings forming a material part of this disclosure.

DISCLOSURE OF INVENTION

For further comprehension of the invention, and of the objects and advantages thereof, reference will be had to the following description and accompanying drawings, and to the appended claims in which the various novel features of the invention are more particularly set forth.

Figure 1:
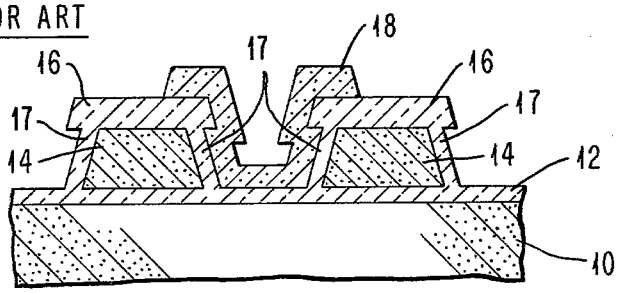
FIG. 1 is a schematic cross section of a semiconductor structure fabricated in accordance with the prior art.

Referring now to FIG. 1, there is shown a portion of a semiconductor chip or wafer as known in the prior art. A monocrystalline silicon substrate 10 supports the entire structure. Substrate 10 can be doped with either P or N type impurities depending on whether N or P channel field effect devices are desired to be fabricated. The substrate may also have formed therein other doped regions formed by either diffusion or ion implantation for specific applications such as charge coupled devices having buried channels, complementary field effect devices, etc.

The substrate 10 is covered with a layer 12, usually thermal silicon dioxide. Layer 12 is usually referred to as gate oxide because it is used as the dielectric between the gate electrode and the channel region therebeneath in the substrate. Gate oxide 12 is formed by exposing the top surface of the silicon 10 to an oxygen containing vapor at an elevated temperature causing the silicon atoms to be converted to silicon dioxide. This thin thermal oxide is then covered by a blanket layer of polysilicon 14. Polysilicon 14 is then covered by a layer of chemical vapor deposited oxide (CVD) 16 which, in turn, is covered by photoresist. The photoresist is exposed and selected portions of CVD layer 16 are etched away by standard photolithographic techniques. The selectively etched CVD layer 16 then becomes the mask for the selective etching of polysilicon layer 14. In order to assure that polysilicon material 14 is completely removed from desired portions of gate oxide 12, the etchant will also attack exposed sidewalls of polysilicon 14 causing the CVD layer 16 to have an overhang. This overhang is partially reduced during a reoxidation of the polysilicon material 14 resulting in thermal oxide insulation 17. Some overhang, however, usually remains so that a subsequently applied layer of polysilicon material 18 will have the irregular topology illustrated in FIG. 1. Not only is this structure susceptible to dielectric problems between polysilicon 14 and polysilicon 18 but the irregular topology of layer 18 is difficult to achieve. Thus, discontinuities and irregularities in layer 18 can cause subsequent problems with the finished device and also can create difficulties in subsequent processing steps.

In our copending patent application, Garbarino et al "Semiconductor Structure With Improved Isolation Between Two Layers of Polycrystalline Silicon" Ser. No. 902,127, filed May 2, 1978 a similar problem of insulating two polysilicon lines from each other was addressed and solved. Accordingly, that patent application is incorporated herein by reference. In our related application, at FIG. 5 thereof, a structure substantially similar to FIG. 2 in the present application is shown.

Figure 2:
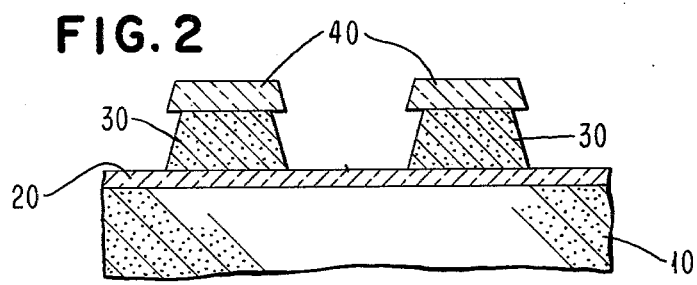
FIG. 2 is a schematic cross section of a semiconductor structure at an early stage in its processing.

Referring now to FIG. 2, there is illustrated an intermediate structure having a substrate 10, preferably monocrystalline silicon covered by a thermal silicon dioxide gate oxide layer 20. Gate oxide 20 is covered with a polysilicon layer 30 which, in turn, is covered with a layer of phosphosilicate glass (PSG) 40. This is a departure from the prior art in that conventionally, layer 40 would be chemical vapor deposited (CVD) silicon dioxide. Layer 40 is selectively etched by conventional photolithographic techniques and, in turn, becomes a mask for the selective etching of polysilicon 30. As is known, polysilicon 30 must be etched completely down to the top surface of gate oxide 20. As the etching proceeds, a portion of the sidewall of polysilicon 30 will also be eroded by the etchant resulting in the illustrated undercut of polysilicon 30—and overhang by PSG layer 40.

Figure 3:
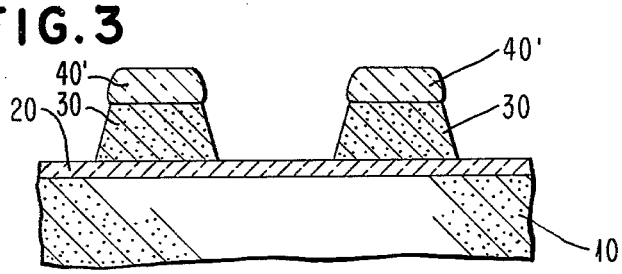
FIG. 3 is a schematic cross section of the semiconductor structure after phosphosilicate glass (PSG) reflow.

In order to substantially reduce, and perhaps even eliminate, the illustrated overhang, the structure of FIG. 2 is subjected to a heat cycle. This causes the PSG material 40 to "snap back". As illustrated in FIG. 3 this eliminates or substantially eliminates the overhang. A further advantage of the snap back action caused by the reflow of the PSG is the substantial elimination of pin holes. A further advantage is that excess phosphorus carriers in the PSG can be used to dope polysilicon 30 to an N conductivity type. In order to behave nearly as a conductor, polysilicon 30 is doped with phosphorus to an impurity concentration in the order of $10^{20}$. Thus, even if polysilicon 30 is previously doped by conventional techniques, the additional N type phosphorus impurities obtained from the PSG source further enhance the conductivity characteristics. The exact shape of the reflowed PSG 40' relative to the polysilicon pedestal shaped structure 30 will vary depending on the initial amount of overhang, the thickness of the initial PSG layer 40 as well as the temperature and time duration of the reflow cycle. FIG. 3, however, shows an exemplary shape which has the same volume as prior to reflow but a lesser lateral extent substantially eliminating the overhang.

At this point in time, the sidewalls of polysilicon 30 must be insulated against contact with subsequently deposited conductive lines. The invention of the above referenced Garbarino et al application could here be used to good advantage. One of the exemplary processes there described involves the passivation of the sidewalls of polysilicon 30 with PSG followed by a thermal oxidation step. In the thermal oxidation step, oxygen atoms penetrate the PSG layer converting portions of the polysilicon material 30 in situ, into silicon dioxide. This results in a composite insulating layer described in the above referenced patent application. Other techniques described therein are equally applicable.

Figure 4:
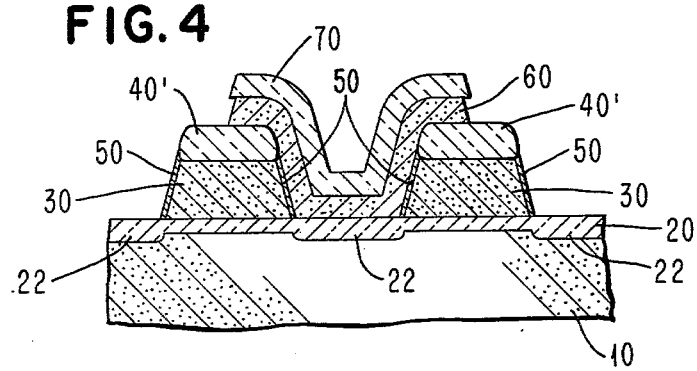
FIG. 4 is a schematic cross section of the semiconductor structure at a still further stage in its processing.

Conventionally, the sidewall of polysilicon 30 may be thermally oxidized converting the polysilicon atoms, in situ, to silicon dioxide forming insulating layer 50 as shown in FIG. 4. As the oxygen atoms oxidize the polysilicon material 30 into silicon dioxide 50, material expansion takes place eliminating whatever overhang might have been left in the FIG. 3 structure. During this thermal oxidation of the sidewalls of polysilicon 30, oxygen atoms also penetrate through the gate oxide 20, oxidizing portions of the silicon substrate into somewhat thicker gate oxide regions 22.

As shown in FIG. 4, once the polysilicon sidewalls have been oxidized the structure may be blanket covered with a second layer of conductive polysilicon 60. Polysilicon 60 can be doped either during or after deposition to render it conductive. It is conventional to blanket deposit polysilicon 60, covered with a further insulating layer 70, which is further covered with photoresist. Insulating layer 70 usually is either chemical vapor deposited oxide or a composite layer including first a thin layer of thermal oxide covered by the CVD. Insulating layer 70 is selectively etched by standard photolithographic techniques and then in turn is used as a mask to selectively remove undesired portions of polysilicon layer 60.

Best Mode For Carrying Out The Invention As seen in FIG. 3, the "snap back" phenomenon occurring with the PSG during the heat treatment not only improves the device topology but also eliminates pin holes and thickens the top insulation 40'. In addition, the PSG 40' behaves as a diffusion source and the polysilicon layer 30 may be doped using PSG 40' as a source thereby eliminating the diffusion process routinely used to dope polysilicon 30.

In order to precisely control the thickness and doping level of the PSG layer 40 (FIG. 2), it is preferably formed by a chemical vapor deposition process. An atmosphere containing approximately 2% oxygen ($O_2$), 300 ppm silane ($SiH_4$), and 30 to 60 ppm phosphine ($PH_3$), in a nitrogen ($N_2$) carrier gas at approximately 450° C. forms a PSG film of any desired thickness. A thickness of 0.3 microns is suitable for the present invention.

The deposition of PSG layer 40 (FIG. 2) is followed by a heat cycle to form the "snapped-back" PSG layer 40' (FIG. 3). The heat cycle to produce the structure of FIG. 3 is provided in a nitrogen atmosphere at approximately 1,000° C. for approximately 1 hour. The resultant thickness of layer 40' (FIG. 3) will be as much as 30% thicker than the unreflowed layer 40 (FIG. 2). The lateral extent of the PSG overhang is thereby substantially decreased. Doping of the polysilicon layer 30 takes place during this heat cycle as phosphorous transfers from the PSG to the polysilicon. The reflowed PSG layer provides improved insulation of the top surface of the polysilicon layer not only due to its increased thickness, but also because the heat cycle seals any pin holes that may have been present. Those skilled in the art will recognize that the herein described "snap back" phenomenon occurring with PSG has application in other semiconductor fabrication steps requiring self-aligned insulators on a substrate. Further modifications are also possible. As one example, the heat cycle to produce the structure of FIG. 3 can be provided in any desired inert ambient such as argon, helium, or even a vacuum. In fact, an oxygen ambient could be used if simultaneous oxidation of the polysilicon is desired.

While we have illustrated and described the preferred embodiments of our invention, it is to be understood that we do not limit ourselves to the precise construction herein disclosed and the right is reserved to all changes and modifications coming within the scope of the invention as defined in the appended claims.

Having thus described our invention, what we claim as new, and desire to secure by Letters Patent is:

1. A process for defining areas of polysilicon material on a surface comprising:
depositing a layer of polysilicon material on said surface;

depositing a layer of phosphosilicate glass over said layer of polysilicon material;

forming a pattern of openings in the phosphosilicate glass by photolithography and etching;

using the pattern in the phosphosilicate glass to form a like pattern in the polycrystalline silicon material wherein there is undercutting under the phosphosilicate glass mask; and substantially eliminating the undercutting under the phosphosilicate glass by heat treating the structure to cause the contraction of the phosphosilicate glass.

2. A process as described in claim 1 wherein said step of depositing the layer of phosphosilicate glass takes place at approximately 450° C.

3. A process as in claims 1 or 2 wherein said step of substantially eliminating the undercutting under the phosphosilicate glass by heat treating takes place at approximately 1,000° C. in a nitrogen atmosphere for a period of approximately 1 hour.

4. A process as in claim 1 further comprising the step of:

converting a sidewall portion of said polysilicon material to silicon dioxide.

5. A process as in claim 4 further comprising the step of:

covering said structure with a blanket layer of polysilicon material.

6. A process as in claim 1 wherein said step of substantially eliminating the undercutting under the phosphosilicate glass by heat treating causes dopant from said phosphosilicate glass to diffuse into said polysilicon material.

* * * * *